United States Patent [19]
Sohn

[11] Patent Number: 6,087,210
[45] Date of Patent: Jul. 11, 2000

[54] METHOD OF MANUFACTURING A CMOS TRANSISTOR

[75] Inventor: Yong Sun Sohn, Kyungki-Do, Rep. of Korea

[73] Assignee: Hyundai Electronics Industries, Kyungki-do, Rep. of Korea

[21] Appl. No.: 09/325,343

[22] Filed: Jun. 4, 1999

[30] Foreign Application Priority Data

Jun. 5, 1998 [KR] Rep. of Korea ................. 98-20861

[51] Int. Cl.$^7$ ................................. H01L 21/336
[52] U.S. Cl. ................ 438/217; 438/224; 438/228; 438/231; 438/525
[58] Field of Search ................................. 438/217, 224, 438/228, 231, 525, FOR 187, FOR 188

[56] References Cited

U.S. PATENT DOCUMENTS

| | | |
|---|---|---|
| 4,943,537 | 7/1990 | Harrington, III . |
| 5,122,474 | 6/1992 | Harrington, III . |
| 5,170,232 | 12/1992 | Narita . |
| 5,296,401 | 3/1994 | Mitsui et al. . |
| 5,500,379 | 3/1996 | Odake et al. . |
| 5,516,711 | 5/1996 | Wang . |
| 5,618,740 | 4/1997 | Huang . |
| 5,682,051 | 10/1997 | Harrington, III . |
| 5,688,722 | 11/1997 | Harrington, III . |
| 5,744,371 | 4/1998 | Kadosh et al. . |
| 6,004,854 | 12/1999 | Dennison et al. . |
| 6,008,080 | 12/1999 | Chuang et al. . |

FOREIGN PATENT DOCUMENTS

| | | |
|---|---|---|
| 59-177960 | 10/1984 | Japan . |
| 5075041 | 3/1993 | Japan . |
| 9232524 | 9/1997 | Japan . |
| 10135349 | 5/1998 | Japan . |

*Primary Examiner*—George Fourson
*Assistant Examiner*—Joannie A Garcia
*Attorney, Agent, or Firm*—Pennie & Edmonds LLP

[57] ABSTRACT

The method of manufacturing a CMOS transistor according to the present invention comprises the steps of forming a field oxide at a selected region on a semiconductor substrate to isolate a first region for a NMOS transistor from a second region for a PMOS transistors; forming a P-well region and a N-well region in the first and second regions, respectively; forming a gate oxide film and a gate electrode on selected regions of the first and second regions; implanting low concentration N-type impurities ions to form low concentration impurity implantation regions within the first and second regions; forming spacers at said side walls of the gate electrode and the gate oxide film; forming a high concentration implantation region in the first and second regions; and implanting N-type impurity ions into the second region to form a punch stop doping layer below said low concentration impurity implantation region of the second region.

7 Claims, 2 Drawing Sheets

METHOD OF MANUFACTURING A CMOS TRANSISTOR

BACKGROUND OF THE INVENTION

1. Field of the Invention

The invention relates generally to a method of manufacturing a semiconductor device, and more particularly to a method of manufacturing a CMOS transistor, the process of which is much simpler than that of the dual LDD structure, so that the production yield can be enhanced.

2. Description of the Prior Art

Conventionally, the structure of the CMOS transistor the gate of which is more than 0.3 μm in length, is consisted of an NMOS transistor of a general LDD structure and a PMOS transistor of which a P-channel punch-stop doping region is formed simultaneously when LDD ions are implanted, the sectional view of which is shown in FIG. 1.

Referring now to FIG. 1, the method of manufacturing the CMOS transistor will be described in detail as follows.

A field oxide 102 is formed on a semiconductor substrate 101 to define a first region in which the NMOS transistor will be formed and a second region at which the PMOS transistor. Then, a P-well 103 is formed within the first region of the semiconductor substrate 101 by ion implantation process, and a N-well 104 is formed within the region of the semiconductor substrate 101 by ion implantation process. Thereafter, a gate oxide film 105 and a gate electrode 106 are sequentially formed at a selected region on the first and second regions. Then, low concentration N-type impurities are implanted into the entire structure, thereby forming a low concentration N-type impurity implantation region 107a at the first region of the semiconductor substrate 101, and at the same time forming a P-channel punch stop doping region 107b at the second region of the semiconductor substrate 101. After forming a spacer 108 at the side walls of the gate electrode 106 and the gate oxide film 105, high concentration N-type impurities are implanted to form high concentration N-type impurity implantation region 109a on the semiconductor substrate 101 of the first region, and high concentration P-type impurities are implanted to form high concentration P-type impurity implantation region 109b on the semiconductor substrate 101 of the second region.

In this transistor structure, in case that the NMOS transistor has the gate length of less than 0.3 μm, the junction depth of low concentration impurity implantation region must be made less than 0.12 μm and at the same time the doping concentration of the low concentration impurity implantation region must be lowered in order to prevent the short channel effect.

Meanwhile, in order to form this ultra shallow low concentration impurity implantation region, it is required that the much lower ion implantation energy has to be used than that used in the prior art. However, in case that such a low energy and low concentration ion implantation are used, there is a problem that the punch-through characteristic is greatly deteriorated to cause a problem in a device having the tage length of less than 0.35 μm, since the N-type impurity concentration and diffusion length of the buried channel region of the PMOS transistor are low.

Referring now to FIG. 2, there is shown a conventional method for solving the above-mentioned problems. The method as shown in FIG. 2 is related to a method of forming a CMOS transistor having an ultra shallow dual structure of N-LDD and P-LDD structure, and is capable of forming a transistor having the gate length of less than 0.1 μm. The method shown in FIG. 2 forms punch stop doping regions 210a, 210b below the low concentration impurity implantation region 107a and 107b in the structure shown in FIG. 1. However, as this method requires two times ion implantation mask process for forming the dual LDD, and also a punch stop ion implantation process for making two times large inclination, there are problems that it makes the entire processes more complicated and lowers the production yield.

SUMMARY OF THE INVENTION

It is therefore an object of the present invention to provide a method of manufacturing a CMOS transistor which can be applied to a device having the gate length of less than 0.35 μm, thus improving the production yield.

In order to accomplish the above object, the method of manufacturing a CMOS transistor according to the present invention comprises the steps of forming a device separation film at a selected region over a semiconductor substrate to establish regions in which NMOS and PMOS transistors will be formed, and forming a P-well region and a N-well region at the transistor forming regions, respectively, by means of ions implantation process; forming a gate oxide film and a gate electrode at selected regions over the semiconductor substrate and then implanting low concentration N-type impurities ions into the entire surface of the structure to form a low concentration impurity implantation region; forming spacers at said side walls of said gate electrode and said gate oxide film and then forming a high concentration implantation region at said NMOS transistor forming region, and implanting N-type impurity ions into the PMOS transistor forming region to form a punch stop doping layer below the low concentration impurity implantation region.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF PREFERRED EMBODIMENTS

Figure 1:
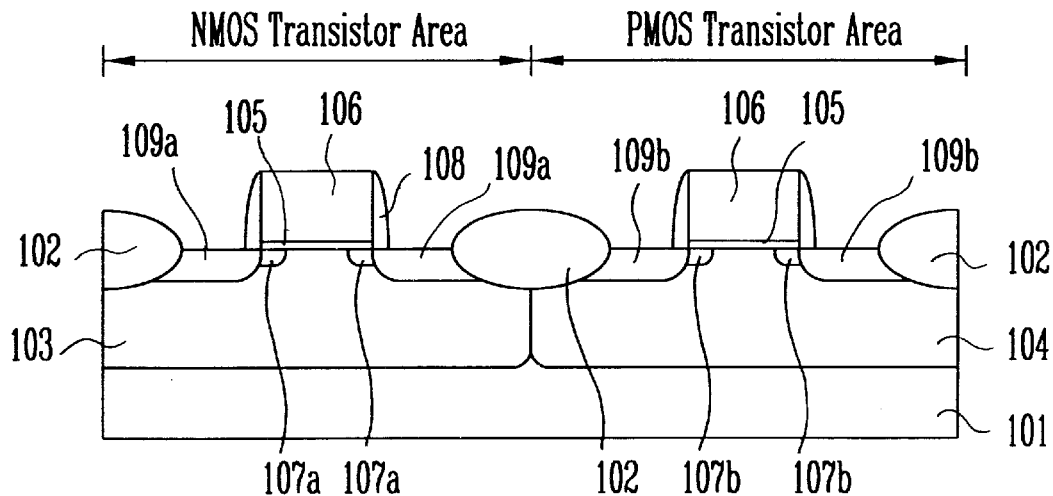
FIG. 1 is a sectional view of a device for illustrating a method of manufacturing a CMOS transistor according to a first embodiment of the prior art.
Figure 2:
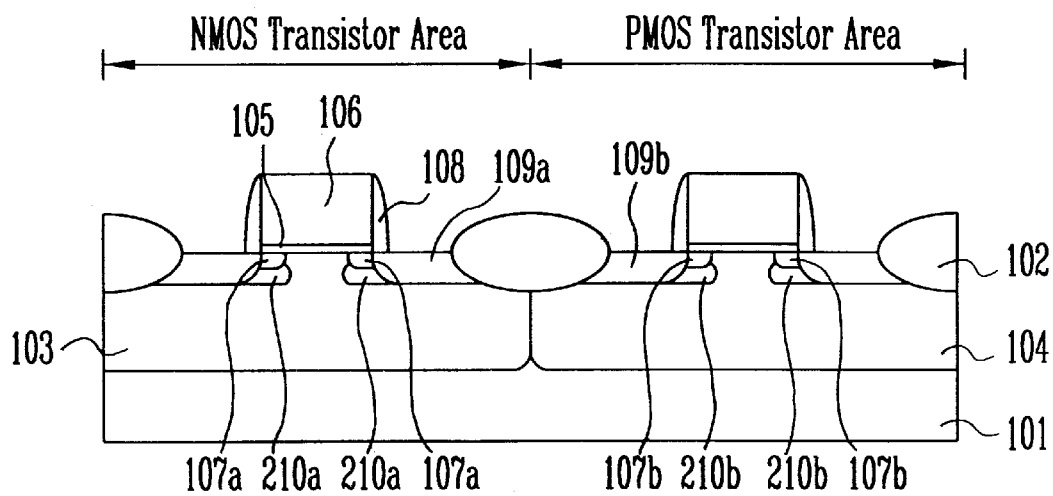
FIG. 2 is a sectional view of a device for illustrating a method of manufacturing a CMOS transistor according to a second embodiment of the prior art.

The present invention will be described in detail by way of a preferred embodiment with reference to accompanying drawings, in which like reference numerals are used to identify the same or similar parts.

FIGS. 3A through 3D are sectional views of devices for illustrating a method of manufacturing a CMOS transistor according to the present invention, wherein the device has a LDD structure the NMOS transistor of which has an ultra shallow junction and the CMOS transistor is formed so that the PMOS transistor thereof has a dual punch stop doping structure.

Figure 3A:
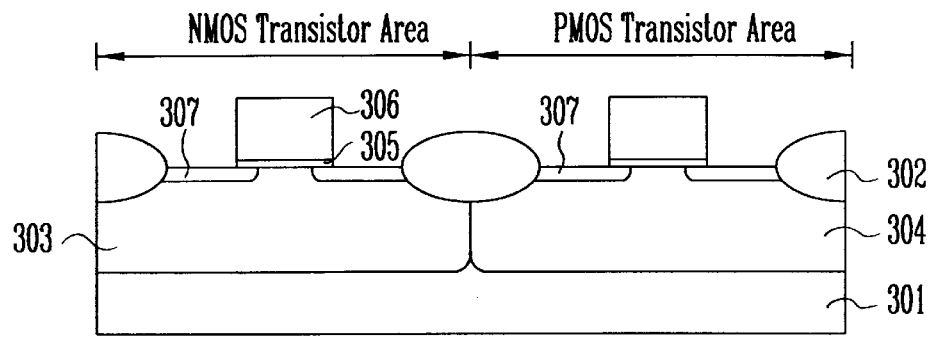
FIGS. 3A through 3D are sectional views of devices for illustrating a method of manufacturing a CMOS transistor according to the present invention.

Referring now to FIG. 3A, a field oxide 302 is formed at a selected region on a semiconductor substrate 301. Then, a Powell 303 is formed in the semiconductor substrate 301 in which the NMOS transistor will be formed, and a N-well 304 is formed in the semiconductor substrate 301 in which the PMOS transistor will be formed. Thereafter, a gate oxide film 305 and a gate electrode 306 are formed at selected regions over the semiconductor substrate 301. Then, low concentration N-type impurities such as phosphorous (P) or Arsenic (As) etc. are implanted with a low energy on the entire structure thereby to form low concentration impurity implantation regions 307 at the region in which the NMOS transistor will be formed and the region in which the PMOS transistor will be formed.

Phosphorous (P) ions are used as the low concentration impurity, a dose of 1.0E12-5E14 ions/cm2 is implanted in the energy of less than 20 KeV. Also, when Arsenic (As) ions are used as the low concentration impurity, the dose of 1.0E12-5E14 ions/cm2 is implanted with the energy of less than 50 KeV.

Figure 3B:
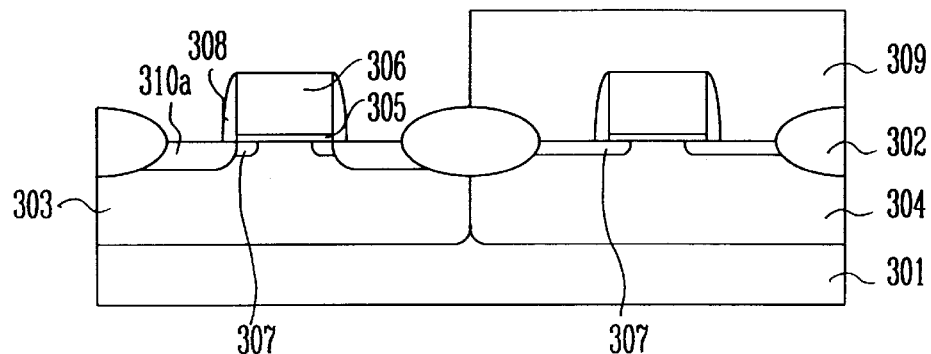

Referring to FIG. 3B, after spacers 308 are formed at the side walls of the gate electrode 306 and the gate oxide film 305, a first photoresist pattern 309 is formed on the region in which the PMOS transistor will be formed. A high concentration N-type impurity ion such as Arsenic (As) is implanted into it using the first photoresist pattern 309 as a mask, thereby to form a high concentration implantation region 310a serving as a source and a drain at the region in which the NMOS transistor will be formed.

Figure 3C:
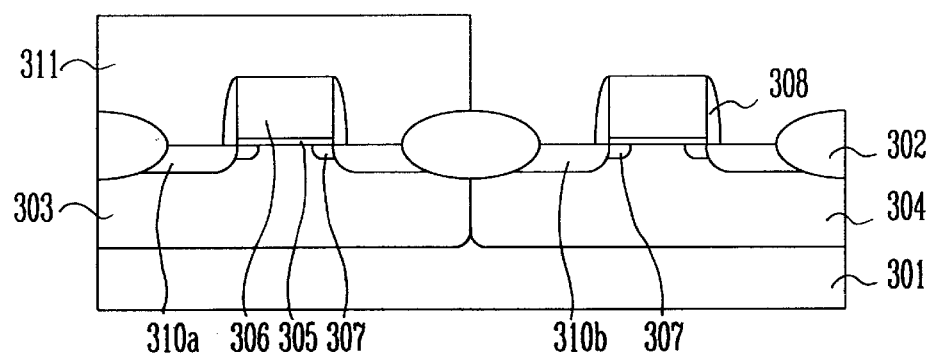

Turning to FIG. 3C, after the first photoresist pattern 309 is removed, a second photoresist pattern 311 is formed at the region in which the NMOS transistor will be formed. High concentration P-type impurity ions consisted of the compound of boron (B) or fluorine etc. are implanted into it using the second photosensitive film pattern 311 as a mask, thereby to form a high concentration implantation region 310b serving as a source and a drain at the region in which the PMOS transistor will be formed.

Figure 3D:
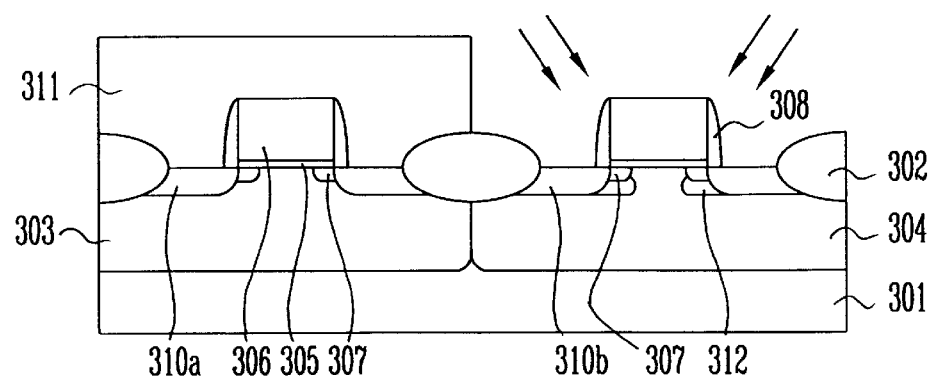

Referring to FIG. 3D, N-type impurity ions such as phosphorous (P) or Arsenic (As) are implanted as a positive direction or more than the position direction at the tilt of 10–60° using the second photoresist pattern 311 as a mask, thereby to form a punch stop doping layer 312 below the low concentration impurity implantation region 307.

When phosphorous (P) ions are used as the punch stop doping layer 312, a dose of 1.0E12-5E.14 ions/cm2 is implanted with the energy of less than 5–30 KeV. Also, when Arsenic (As) ions are used as it, the dose of 1.0E12-5E14 ions/cm2 is implanted with the energy of less than 100 KeV.

Thus, the dual punch stop doping layer consisted of the low concentration implantation region 307 and the punch stop doping layer 312 below it, prevents the punch through a phenomenon from occurring.

Then, after the second photoresist pattern 311 is removed, activation is performed on respective doping layers by means of additional thermal process and thus a CMOS structure having a desired electrical characteristic can be manufactured.

Finally, depending on the type of the device, manufacturing of the device is completed through the known method including interlayer insulation film forming process, contact forming process, interconnection forming process, a capacitor forming process etc.

As mentioned above, according to the present invention, it can form a short channel CMOS transistor having the gate length of 0.3–0.1 μm and can make the process simpler than that of the dual LDD structure, since it uses a novel process of implanting N-type impurity at a large tilt other than the conventional process of forming a single LDD structure.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a CMOS transistor, comprising the steps of:

forming a field oxide at a selected region on a semiconductor substrate to isolate a first region for a NMOS transistor from a second region for a PMOS transistors;

forming a P-well region and a N-well region in said first and second regions, respectively;

forming a gate oxide film and a gate electrode on selected regions of said first and second regions;

implanting low concentration N-type impurities ions to form low concentration impurity implantation regions within said first and second regions;

forming spacers at the side walls of said gate electrode and the gate oxide film;

forming a high concentration implantation region in said first and second regions; and implanting N-type impurity ions into said second region to form a punch stop doping layer below said low concentration impurity implantation region of said second region.

2. The method of manufacturing a CMOS transistor as claimed in claim 1, wherein said low concentration impurity implantation region is formed by implanting either phosphorous (P) ion or arsenic (As) ion.

3. The method of manufacturing a CMOS transistor as claimed in claim 2, wherein said phosphorous ion is implanted at a dose of 1.0E12-5E14 ions/cm2 with an energy of less than 20 KeV.

4. The method of manufacturing a CMOS transistor as claimed in claim 2, wherein said an arsenic ion is implanted at a dose of 1.0E12-5E14 ions/cm2 with an energy of less than 50KeV.

5. The method of manufacturing a CMOS transistor as claimed in claim 1, wherein said punch stop doping layer is formed by implanting either phosphorous (P) ion or arsenic (As) ion at a at an angle of 30–80°.

6. The method of manufacturing a CMOS transistor as claimed in claim 5, wherein said phosphorous ion is implanted at a dose of 1.0E12-5E13 ions/cm2 with an energy of 5 through 30 KeV.

7. The method of manufacturing a CMOS transistor as claimed in claim 5, wherein said arsenic ion is implanted at a dose of 1.0E12-5E-5E13 ions/cm2 with an energy of 10 through 100KeV.

* * * * *